(12) United States Patent
Ogata et al.

(10) Patent No.: US 9,108,231 B2
(45) Date of Patent: Aug. 18, 2015

(54) LIQUID PROCESSING APPARATUS, LIQUID PROCESSING METHOD, AND COMPUTER-READABLE RECORDING MEDIUM HAVING PROGRAM STORED THEREIN

(71) Applicant: Tokyo Electron Limited, Tokyo (JP)

(72) Inventors: Nobuhiro Ogata, Kumamoto (JP); Terufumi Wakiyama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/466,240

(22) Filed: Aug. 22, 2014

(65) Prior Publication Data

US 2014/0360540 A1 Dec. 11, 2014

Related U.S. Application Data

(62) Division of application No. 13/448,491, filed on Apr. 17, 2012, now Pat. No. 8,845,815.

(30) Foreign Application Priority Data

Apr. 18, 2011 (JP) ................................ 2011-092430

(51) Int. Cl.
*B08B 3/10* (2006.01)
*B08B 3/04* (2006.01)
*B08B 3/02* (2006.01)
*H01L 21/67* (2006.01)

(52) U.S. Cl.
CPC .............. *B08B 3/10* (2013.01); *H01L 21/6715* (2013.01); *H01L 21/67034* (2013.01); *H01L 21/67051* (2013.01); *B08B 3/02* (2013.01); *B08B 3/022* (2013.01); *B08B 3/024* (2013.01); *B08B 3/04* (2013.01); *B08B 3/041* (2013.01); *B08B 3/048* (2013.01); *H01L 21/67017* (2013.01); *Y10S 134/902* (2013.01)

(58) Field of Classification Search
CPC .......... B08B 3/04; B08B 3/041; B08B 3/048; B08B 3/02; B08B 3/022; B08B 3/024; H01L 21/6715; H01L 21/67017; H01L 21/67051; H01L 21/67034
See application file for complete search history.

(56) References Cited

U.S. PATENT DOCUMENTS

| 5,906,860 | A  | * | 5/1999  | Motoda et al. ................. 427/240 |
| 6,247,479 | B1 | * | 6/2001  | Taniyama et al. ............ 134/95.2 |
| 7,584,760 | B2 |   | 9/2009  | Miya et al. |
| 2014/0360540 | A1 | * | 12/2014 | Ogata et al. ................. 134/56 R |
| 2015/0090301 | A1 | * | 4/2015  | Higuchi et al. ................. 134/23 |

FOREIGN PATENT DOCUMENTS

JP 2000-183010 A 6/2000
JP 2006-286832 A 10/2006

* cited by examiner

*Primary Examiner* — Bibi Carrillo
(74) *Attorney, Agent, or Firm* — Abelman, Frayne & Schwab (57) ABSTRACT

Disclosed is a liquid processing apparatus including first and second cups installed so as to surround a rotation holding unit of a substrate and guide a processing liquid scattered from the rotating substrate downwards. A first driving unit and a second driving unit elevate the first cup and the second cup between a position receiving the processing liquid and the lower position thereof. A controller controls that the first cup and the second cup are ascended at the same time by transferring the driving force of the first driving unit while the first cup or a first elevating member thereof is overlapped with the second cup or a second elevating member thereof from the lower side by setting the ascending speed of the first cup to be higher than the ascending speed of the second cup when the first and second cups are ascended at the same time.

6 Claims, 7 Drawing Sheets

LIQUID PROCESSING APPARATUS, LIQUID PROCESSING METHOD, AND COMPUTER-READABLE RECORDING MEDIUM HAVING PROGRAM STORED THEREIN

CROSS REFERENCE TO RELATED APPLICATIONS

This application is a divisional of U.S. patent application Ser. No. 13/448,491, filed on Apr. 17, 2012 now U.S. Pat. No. 8,845,815, which claims priority from Japanese Application No. 2011-092430 filed on Apr. 18, 2011, both of which are incorporated herein by reference.

TECHNICAL FIELD

The present disclosure relates to a single wafer type liquid processing apparatus for liquid-processing an object to be processed by using a processing liquid.

BACKGROUND

In a manufacturing process of semiconductor products or flat panel displays (FPDs), a liquid processing has been widely used where a processing liquid is supplied to a semiconductor wafer or glass substrate (a substrate to be processed). As an example of the liquid processing, a cleaning processing is known that removes, for example, particles and contamination attached to the substrate.

As a liquid processing apparatus performing the liquid processing to the semiconductor wafer ("wafer"), there is known a single wafer type liquid processing apparatus, which performs the liquid processing by supplying a processing liquid to the surface or the backside thereof while holding the wafer on a spin chuck configured to be rotatable around a vertical shaft to rotate the wafer.

The processing liquid supplied to the rotating wafer is flung away from the wafer by the centrifugal force to such an extent that the processing liquid becomes droplets or mists and are scattered around the spin chuck. Accordingly, in the liquid processing apparatus, an annular cover referred as, for example, a cup is installed for receiving and guiding the scattered processing liquid to a discharging line of the processing liquid.

For example, Japanese Patent Application Laid-Open No. 2000-183010 (see, for example, claim 4, paragraphs [0036] to [0038], and FIGS. 4 and 5) discloses a single wafer type substrate processing apparatus having the configuration in which two kinds of cups having different sizes are disposed to be stacked up so as to surround the spin chuck and an inner cup can be elevatable. In the substrate processing apparatus, during the liquid processing with a chemical liquid (processing liquid), the inner cup is descended below the spin chuck and an outer cup receives the chemical liquid scattered around to guide the received chemical liquid to a recovery line, while during a rinse processing using a rinse liquid such as deionized water (DIW), the retreated inner cup is ascended to receive the rinse liquid scattered around to discharge the rinse liquid through a line separated from that of the chemical liquid. However, in the substrate processing apparatus disclosed in Japanese Patent Application Laid-Open No. 2000-183010, since only one elevatable cup is provided, in the case of using a plurality of kinds of chemical liquids in addition to the rinse liquid, the cups cannot be differentially used according to the used chemical liquids and those chemical liquids cannot be separately recovered and discharged.

From the above viewpoint, Japanese Patent No. 4531612 (see, for example, claim 1, paragraphs [0014], [0057] to [0060], and FIGS. 8 and 9) discloses a substrate processing apparatus in which three elevatable guiding parts (cups) are disposed to be stacked around the spin chuck and each of the guiding parts is elevated according to a kind of processing liquid used to differentially discharge a rinse liquid or the processing liquid. When two inner guiding parts near the spin chuck are elevated at the same time, an elevating operation is performed while a very small gap between the guiding parts is maintained.

SUMMARY

An exemplary embodiment of the present invention provides a liquid processing apparatus, including: a rotation holding unit that holds and rotates a substrate to be processed around a vertical shaft; a processing liquid supply unit that supplies a processing liquid onto a target surface of the substrate held by the rotation holding unit; a first cup and a second cup installed from an inner side in sequence, each configured to surround the rotation holding unit and receive the processing liquid scattered from the substrate to guide the received processing liquid downwards; a first driving unit configured to elevate the first cup through a first elevating member between a processing position receiving the processing liquid scattered from the rotating substrate and a retracting position retracted from the processing position to the lower side and to change a set value of an elevating speed of the first cup; a second driving unit configured to elevate the second cup through a second elevating member between a processing position receiving the processing liquid scattered from the rotating substrate and a retracting position retracted from the processing position to the lower side and to change a set value of an elevating speed of the second cup; and a controller that outputs a control signal to the first driving unit and the second driving unit so that the set value of an ascending speed of the first cup is larger than the set value of an ascending speed of the second cup, when the first cup and the second cup are ascended at the same time. The first cup or the first elevating member is overlapped with the second cup or the second elevating member from the lower side to transfer the driving force of the first driving unit to the second cup or the second elevating member, and thus the first cup and the second cup are ascended at the same time.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the substrate processing apparatus disclosed in Japanese Patent No. 4531612, by maintaining the very small gap between two guiding parts which are elevated at the same time, another processing liquid is prevented from being introduced to a discharge path (gap between two guiding parts) which is not intended. It is also described that a specific method of elevating while maintaining the gap between the guiding parts small is to elevate the two guiding parts in synchronization (simultaneously at the same speed).

According to Japanese Patent No. 4531612, the substrate processing apparatus includes an independent driving mechanism for elevating each cup. Accordingly, in order to synchronize the elevating operation between the two guiding parts, a high control system capable of controlling an operation start timing or a driving speed of the different driving mechanisms is required such that equipment costs are increased.

The present disclosure has been made in an effort to provide a liquid processing apparatus capable of elevating two cups at the same time by a simple method.

An exemplary embodiment of the present invention provides a liquid processing apparatus, including: a rotation holding unit that holds and rotates a substrate to be processed around a vertical shaft; a processing liquid supply unit that supplies a processing liquid onto a target surface of the substrate held by the rotation holding unit; a first cup and a second cup installed from an inner side in sequence, each configured to surround the rotation holding unit and receive the processing liquid scattered from the substrate to guide the received processing liquid downwards; a first driving unit configured to elevate the first cup through a first elevating member between a processing position receiving the processing liquid scattered from the rotating substrate and a retracting position retracted from the processing position to the lower side and to change a set value of a elevating speed of the first cup; a second driving unit configured to elevate the second cup through a second elevating member between a processing position receiving the processing liquid scattered from the rotating substrate and a retracting position retracted from the processing position to the lower side and to change a set value of a elevating speed of the second cup; and a controller that outputs a control signal to the first driving unit and the second driving unit so that the set value of an ascending speed of the first cup is larger than the set value of an ascending speed of the second cup, when the first cup and the second cup are ascended at the same time. The first cup or the first elevating member is overlapped with the second cup or the second elevating member from the lower side to transfer the driving force of the first driving unit to the second cup or the second elevating member and thus the first cup and the second cup are ascended at the same time.

The liquid processing apparatus may have the following features.

(a) The controller may output the control signal to the first driving unit and the second driving unit so that the set value of a descending speed of the second cup is larger than the set value of a descending speed of the first cup when the first cup and the second cup are descended at the same time, and descend the first cup and the second cup at the same time by transferring the driving force of the second driving unit to the first cup or the first elevating member while the second cup or the second elevating member is overlapped with the first cup or the first elevating member from the upper side.

(b) The controller may output the control signal to the second driving unit so that the ascending speed when only the second cup is ascended is higher than the ascending speed when the first cup and the second cup are ascended at the same time.

(c) The liquid processing apparatus may further include a sealing part that seals a gap formed between the first cup and the second cup when the first cup and the second cup are ascended at the same time.

(d) The sealing part may be installed to at least one side of the first cup and the second cup. The controller may output the control signal to the first driving unit and the second driving unit so that the first cup and the second cup are ascended at the same time after sealing the gap with the sealing part, by positioning the second cup above the first cup where the gap is not sealed with the sealing part when the first cup and the second cup are descended up to the retracting position and by starting the ascending of the first cup to be faster than that of the second cup when the first cup and the second cup are ascended.

(e) The controller may output the control signal to the first driving unit so that the descending speed when only the first cup is descended is higher than the descending speed when the first cup and the second cup are descended at the same time.

(f) The liquid processing apparatus may further include a sealing part that seals the gap formed between the first cup and the second cup when the first cup and the second cup are descended at the same time.

(g) The sealing part may be installed to at least one side of the first cup and the second cup. The controller may output the control signal to the first driving unit and the second driving unit so that the first cup and the second cup are descended at the same time after sealing the gap with the sealing part, by positioning the first cup below the second cup where the gap is not sealed with the sealing part when the first cup and the second cup are ascended up to the processing position and by starting the descending of the second cup to be faster than that of the first cup when the first cup and the second cup are descended.

Another exemplary embodiment of the present invention provides a liquid processing method comprising: elevating a first cup and a second cup, which are installed from the inner side in sequence so as to surround a substrate to be processed, between a processing position receiving a processing liquid scattered from the substrate and a retracting position at the lower side of the processing position; supplying the processing liquid onto a target surface of the substrate rotating around a vertical shaft; and when the first cup and the second cup are ascended to the processing position from the retracting position at the same time, ascending the first cup and the second cup at the same time by pushing up the second cup or a second elevating member while the first cup or the first elevating member for elevating the first cup is overlapped with the second cup or the second elevating member for elevating the second cup from the lower side, and by setting the ascending speed of the first cup to be higher than the ascending speed of the second cup.

Yet another exemplary embodiment of the present invention provides a computer-readable recording medium storing a program that when executed, causes a computer to perform the liquid processing method as described above. The program is used in a liquid processing apparatus performing a liquid processing by supplying a processing liquid from a processing liquid supply unit onto a target surface of a substrate to be processed held by a rotation holding unit and rotating around a vertical shaft.

According to the exemplary embodiments of the present disclosure, portions where the first and second cups or the elevating members thereof may be vertically overlapped with each other are provided at the first and second cups disposed to be adjacent to each other around the rotation holding unit where the liquid processing of the target substrate is performed or at the elevating members for the elevating operation thereof. Since the driving force of the first driving unit installed at the first cup is transferred to the second cup side through the portions which are vertically overlapped with each other, by setting the value of the ascending speed of the first cup to be larger than that of the ascending speed of the second cup when the cups are ascended at the same time, it is possible to ascend the two cups at the same time without a synchronization control.

The configuration of a liquid processing apparatus 1 according to an exemplary embodiment of the present disclosure will be described with reference to FIG. 1. Liquid processing apparatus 1 includes a spin chuck 21 holding a wafer W, a rotating shaft 22 supporting spin chuck 21 at the lower side thereof and rotating spin chuck 21 by a rotating motor 23, a processing liquid nozzle 31 for supplying a processing liquid onto the surface to be processed (target surface) (a top surface in the exemplary embodiment) of wafer W, and three cups 51 to 53 receiving the processing liquid flung away from rotating wafer W to guide the received processing liquid to the lower side thereof.

Spin chuck 21 is a disk-shaped member for holding wafer W, and a suction hole (not shown) connected to, for example, a vacuum pump for absorbing and holding wafer W at the backside (bottom surface) is opened at the upper surface of spin chuck 21. Elevating pins (not shown) are disposed at spin chuck 21 and may protrude from the upper surface of spin chuck 21 to elevate and transfer wafer W between the spin chuck and an outer transfer arm.

A guiding part 24 which is supported by a support member 241 above the periphery of spin chuck 21 forms a gap between the guiding part and spin chuck 21 to guide the processing liquid flung away from rotating wafer W toward cups 51 to 53 through the gap.

Rotating shaft 22 is connected to rotating motor 23 disposed at a base plate 10 of liquid processing apparatus 1 and rotates spin chuck 21 by driving rotating motor 23. Spin chuck 21, rotating shaft 22, and rotating motor 23 correspond to a rotation holding unit of the exemplary embodiment.

Processing liquid nozzle 31 supplies various processing liquids onto the top surface of wafer W. Processing liquid nozzle 31 is supported by a nozzle arm 32 and may move between a processing position above wafer W held on spin chuck 21 and a retracting position retracted from the processing position. Processing liquid nozzle 31 is connected to various liquid supply units 42 to 45 through a switching valve 41.

An acidic liquid supply unit 43 supplies an acidic processing liquid such as a diluted hydrofluoric acid aqueous solution (DHF) and an alkali liquid supply unit 44 supplies an alkali processing liquid such as an SC1 liquid (mixed solution of ammonia and peroxide). A rinse liquid supply unit 45 supplies a rinse liquid such as deionized water (DIW) for a rinse cleaning and an organic liquid supply unit 42 supplies isopropyl alcohol (IPA) as an organic solvent for a dry processing.

Three annular cups 51 to 53 are disposed around spin chuck 21 and configured to receive the processing liquid scattered from the gap to guide the received processing liquid downwards. Hereinafter, cups 51 to 53 are referred as a first cup 51, a second cup 52, and a third cup 53 in order from the inside close to spin chuck 21.

First cup 51 disposed most closely to spin chuck 21 faces an inner wall surface of an annularly-formed board toward the above-described gap formed between spin chuck 21 and guiding part 24, and the processing liquid is received in the inner wall surface to be guided downwards. A curved part 511 curved inwards in the direction of spin chuck 21 is formed along a circumferential direction at the upper end of first cup 51. Curved part 511 suppresses the mist of the processing liquid from flowing out toward the upper side of first cup 51 and also serves as a coupling part to be described below.

Two guiding parts 512 extended downwards are formed along a circumferential direction from the lower end of first cup 51 and may drop the processing liquid flowing at the inner wall side or the outer wall side of first cup 51 toward liquid discharging grooves 11 and 12 to be described below.

A plurality of support members 611 are connected to the bottom of first cup 51 interposed between two guiding parts 512 with intervals in a circumferential direction. The lower ends of support members 611 are connected to, for example, a connecting member 612 formed in an annular common board, and connecting member 612 is supported by an actuator 610 including, for example, an air cylinder through an elevating shaft 613.

First cup 51 supported by support members 611 moves between a processing position where the scattered processing liquid from rotating wafer W is received and a retracting position retracted to the lower side from the processing position by protruding elevating shaft 613 from actuator 610. Actuator 610 may receive a control signal from a controller 7 to be described below and switch a protruding/retracting speed of elevating shaft 613 between a reference set which is a normal speed and a low-speed set which is lower than the reference set to change the elevating speed of first cup 51. Support members 611, connecting member 612, and elevating shaft 613 correspond to a first elevating member of first cup 51, and actuator 610 corresponds to a first driving unit.

Second cup 52 is a member disposed at an external position of first cup 51 and is the same as the aforementioned first cup 51 in that the inner wall surface of the annularly-formed board is disposed to face the gap between spin chuck 21 and guiding part 24, a curved part 521 curved inwards is formed at the upper end thereof, and two guiding parts 522 extended downwards are formed at the lower end thereof.

Meanwhile, curved part 521 of second cup 52 extends up to the upper side of curved part 511 of first cup 51, and curved parts 511 and 521 may be coupled (overlapped) with each other by contacting the upper surface of curved part 511 of first cup 51 to the lower surface of curved part 521 of second cup 52. From this viewpoint, curved part 521 of second cup 52 serves as a coupling part coupled with curved part 511 of first cup 51.

As in first cup 51, second cup 52 is connected to support members 621, a connecting member 622, an elevating shaft 623, and an actuator 620. As a result, second cup 52 may also move between a processing position of the upper side and a retracting position retracted to the lower side from the processing position. As in actuator 610, actuator 620 may receive a control signal from controller 7 and switch a protruding/retracting speed of elevating shaft 623 into the reference set or the low-speed set to change a lifting speed of second cup 52. Support members 621, connecting member 622, and elevating shaft 623 correspond to a second lifting member of second cup 52, and actuator 620 corresponds to a second driving unit.

Figure 3:
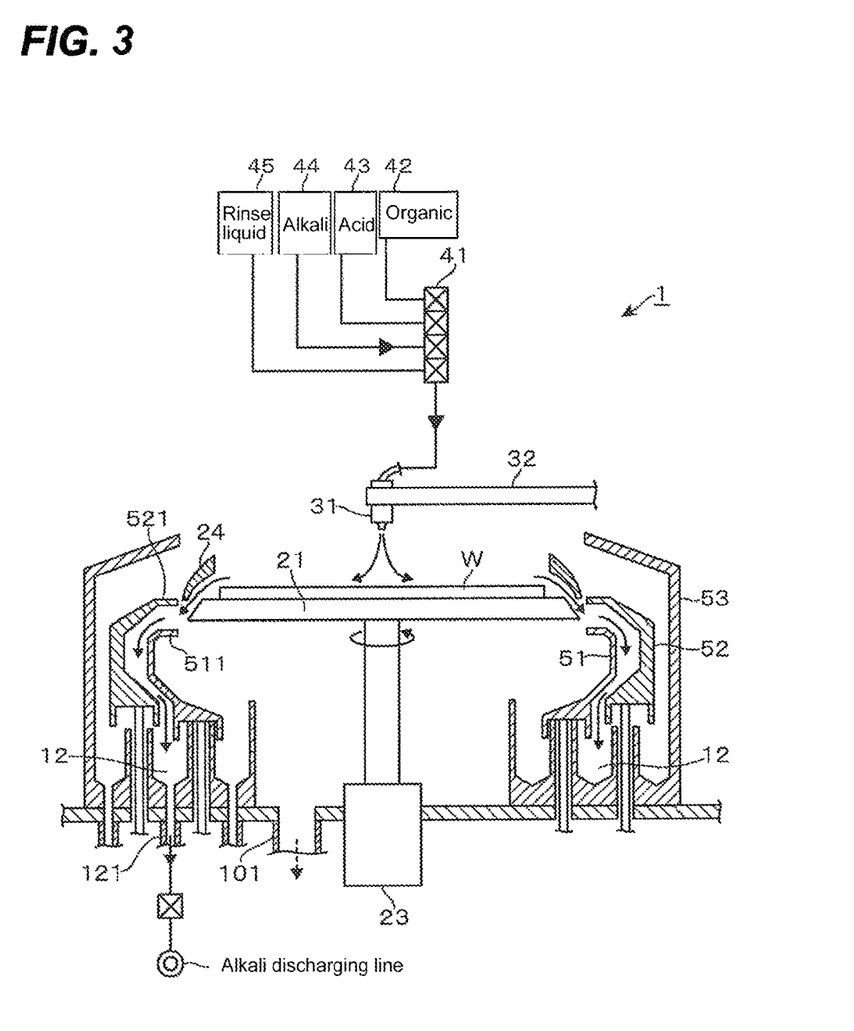
FIG. 3 is a first explanatory diagram illustrating a liquid processing operation of the liquid processing apparatus.

As shown in FIG. 3, second cup 52 configured as described above is used to form a flow channel where the processing liquid flows down between the outer wall surface of first cup 51 and the inner wall surface of second cup 52 by descending first cup 51 to the retracting position and ascending second cup 52 to the processing position. Accordingly, the processing liquid scattered from rotating wafer W to be received in the inner wall surface of second cup 52 is guided downwards.

Third cup 53 is disposed to face an inner wall surface of an annularly-formed board toward the gap formed between spin chuck 21 and guiding part 24, at an outer position from first cup 51 and second cup 52, and the processing liquid is received in the inner wall surface to be guided downwards. A curved part 531 curved inwards is formed at the upper end of third cup 53, and curved part 531 is extended up to the upper side regions of first cup 51 and second cup 52.

Figure 5:
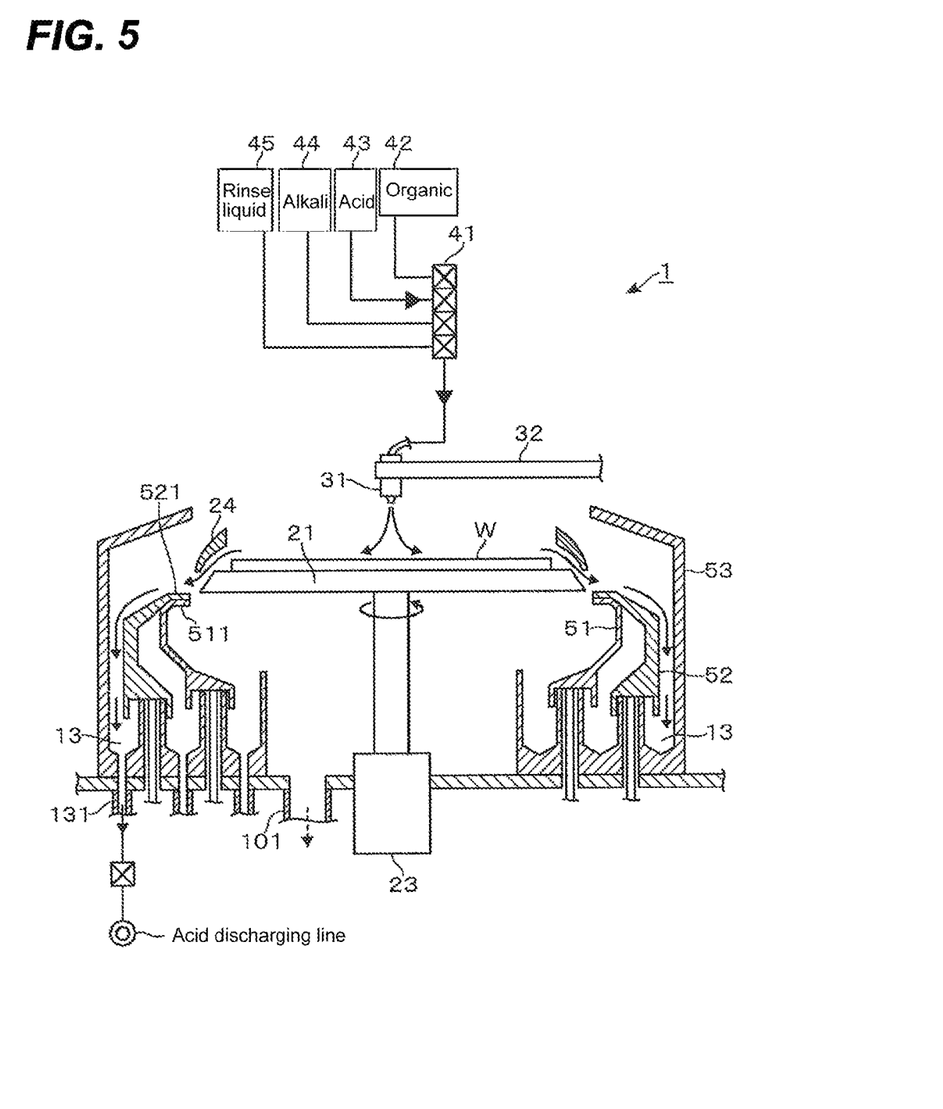
FIG. 5 is a third explanatory diagram illustrating the liquid processing operation of the liquid processing apparatus.

In the exemplary embodiment, third cup 53 has a structure fixed to base plate 10 of liquid processing apparatus 1. As shown in FIG. 5, when first cup 51 and second cup 52 are descended up to the retracting position, a flow channel where the processing liquid flows down is formed between the outer wall surface of second cup 52 and the inner wall surface of third cup 53. As a result, the processing liquid scattered from rotating wafer W is received in the inner wall surface of third cup 53 and flows down through the flow channel to be guided downwards.

Figure 1:
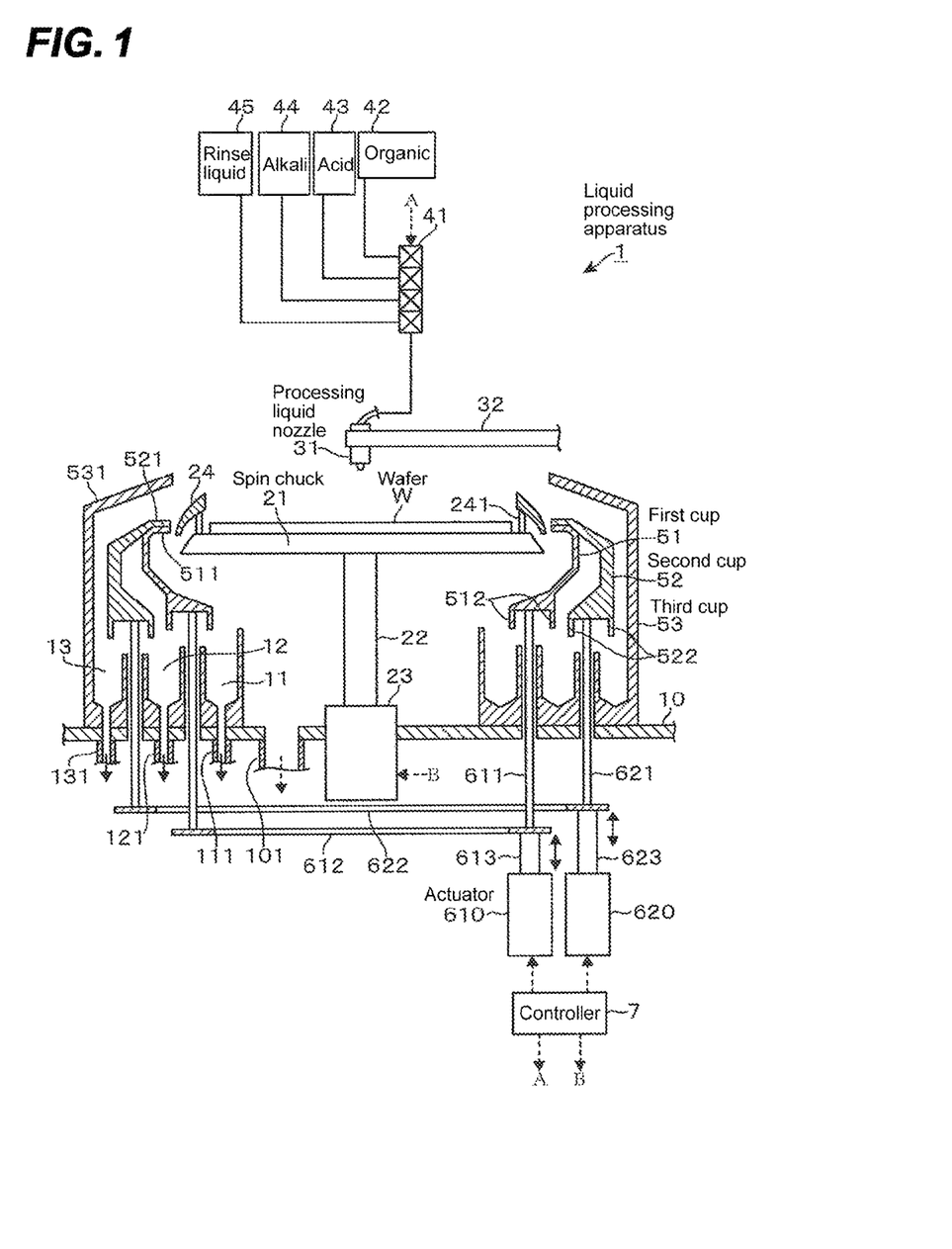
FIG. 1 is a vertical side view illustrating the configuration of a liquid processing apparatus according to an exemplary embodiment of the present disclosure.

As shown in FIG. 1, three liquid discharging grooves (a first liquid discharging groove 11, a second liquid discharging groove 12, and a third liquid discharging groove 13) for discharging the processing liquid are formed separately from each other along circumferential directions of cups 51 and 52, at the lower positions of first cup 51 and second cup 52. Liquid discharging pipes 111, 121, 131 are connected to liquid discharging grooves 11, 12, 13, respectively.

The processing liquid received in first cup 51 is dropped into first liquid discharging groove 11 from guiding part 512 and flows through first liquid discharging groove 11 to be discharged outside through liquid discharging pipe 111. The processing liquid received in second cup 52 passes through the flow channel between first cup 51 and second cup 52, is dropped into second liquid discharging groove 12 from guiding parts 512 and 522, and flows through second liquid discharging groove 12 to be discharged outside through liquid discharging pipe 121.

The processing liquid received in third cup 53 passes through the flow channel between second cup 52 and third cup 53, flows down along the inner wall surface of third cup 53, is dropped from guiding part 522 to flow into third liquid discharging groove 13, and is discharged outside through liquid discharging pipe 131 from third liquid discharging groove 13.

Reference numeral 101 shown in FIG. 1 represents an exhaust pipe for exhausting a surrounding atmosphere which enters into liquid processing apparatus 1 such as a downflow of clean air formed in a case (not shown) housing liquid processing apparatus 1.

Liquid processing apparatus 1 including the above-described configuration is connected to controller 7 as shown in FIG. 1. For example, controller 7 includes a computer (not shown) including a CPU and a storage unit storing a program. The program includes step (command) group related to the operation of liquid processing apparatus 1, that is, operations including disposing wafer W at spin chuck 21, performing the liquid processing by switching various processing liquids while rotating wafer W, drying wafer W, and carrying out wafer W and so on. The program is stored in, for example, a recording medium such as a hard disk, a compact disk, a magnet optical disk, and a memory card, and is installed in the computer therefrom.

Particularly, controller 7 of the exemplary embodiment records kinds of processing liquid supplied from the processing liquid nozzle 31 and corresponding cups 51 to 53 receiving each processing liquid to discharge the received processing liquid to the outside. Controller 7 may change cups 51 to 53 to be used by elevating first cup 51 or second cup 52 at a timing of switching the processing liquids, and may differentially discharge and recover the processing liquid. In the exemplary embodiment, each of the processing liquids corresponds to cups 51 to 53 so that first cup 51 is used for the rinse cleaning with DIW and the IPA drying, second cup 52 is used for the liquid processing with the alkali processing liquid, and third cup 53 is used for the liquid processing with the acidic processing liquid.

Controller 7 of the exemplary embodiment has a function of outputting the control signal with respect to actuators 610 and 620 so as to change the elevating speed of each cup 51 or 52 according to the moving direction of first cup 51 and second cup 52 which move according to the switch of the processing liquid or a combination of movement or stop of first cup 51 and second cup 52.

Particularly, when first cup 51 and second cup 52 move in the same direction at the same time, controller 7 has a function of setting so that the elevating speed of one of cups 51 and 52 disposed at the rear side in the elevating direction, is higher than that of the other cups 51 and 52 disposed at the front side in the elevating direction. By setting the elevating speed, the coupling parts (curved parts 511 and 521) of first cup 51 and second cup 52 may be vertically overlapped with each other. Accordingly, the driving force of first actuator 610 is transferred to second cup 52 during ascending and the driving force of second actuator 620 is transferred to first cup 51 during descending, such that two cups 51 and 52 may be integrally elevated.

Specifically, as shown in Table 1, when first cup 51 and second cup 52 are ascended at the same time, the ascending speed of second cup 52 is set at a low speed and the ascending speed of first cup 51 is set at a reference speed. First cup 51 and second cup 52 may be integrally ascended by pushing up the coupling part (curved part 521) disposed at the upper side by the coupling part (curved part 511) disposed at the lower side.

When first cup 51 and second cup 52 are descended at the same time, the descending speed of first cup 51 is set at a low speed and the descending speed of second cup 52 is set at a reference speed. First cup 51 and second cup 52 may be integrally descended by pushing down the coupling part (curved part 511) disposed at the lower side by the coupling part (curved part 521) disposed at the upper side.

When first cup 51 or second cup 52 is separately elevated, the elevating speeds thereof are set at the reference speed so as to complete the movement in a short time.

TABLE 1

|  | During ascending | | During descending | |
| --- | --- | --- | --- | --- |
|  | Integral ascending | Separate ascending | Integral descending | Separate descending |
| First cup | Reference | Reference | Low-speed | Reference | Stop |
| Second cup | Low-speed | Stop | Reference | Stop | Reference |

Figure 2:
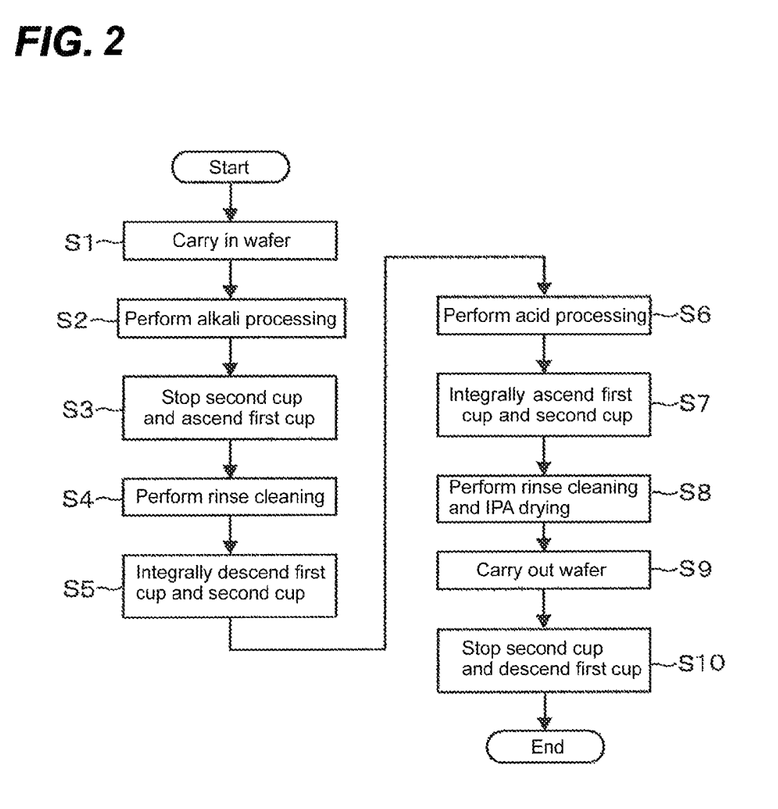
FIG. 2 is a flowchart illustrating an operational flow when a wafer is processed by the liquid processing apparatus.

Hereinafter, the operation of liquid processing apparatus 1 according to the exemplary embodiment will be described with reference to FIGS. 2 to 4. First, when the outer transfer arm enters into the upper position of spin chuck 21 while wafer W is held by transfer arm (start), elevating pins (not shown) are ascended from spin chuck 21 and the transfer arm and the elevating pins are crossed with each other to transfer wafer W to the elevating pins. Thereafter, wafer W is disposed on spin chuck 21 by descending the elevating pins (step S1).

At this time, as shown in FIG. 3, second cup 52 and first cup 51 move up to the processing position and the retracting position in advance, respectively, and are on standby while forming a flow channel between cups 52 and 51. Thereafter, the liquid processing starts by rotating wafer W and supplying the alkali processing liquid from alkali liquid supply unit 44 (step S2).

The alkali processing liquid supplied onto the surface of rotating wafer W is spread on the surface of wafer W while removing particles or organic contaminants and reaches the periphery of spin chuck 21. The processing liquid reaching the periphery of spin chuck 21 is flung away around spin chuck 21 through the gap between guiding part 24 and spin chuck 21, and enters into the flow channel formed between first cup 51 and second cup 52 to be received in the inner wall surface of second cup 52. The processing liquid is guided to the inner wall surface of second cup 52 or the outer wall surface of first cup 51, flows down, and then enters into second liquid discharging groove 12 to be recovered to a recovery tank through liquid discharging pipe 121 or discharged to the outside.

When the liquid processing with the alkali processing liquid is completed for a predetermined time, the processing liquid supplied to processing liquid nozzle 31 is switched into the rinse liquid from rinse liquid supply unit 45 and first cup 51 of the retracting position is ascended up to the processing position at the reference speed (step S3). Wafer W is rinsed and the rinse liquid flung away around spin chuck 21 is received in first cup 51 to be discharged to the outside through first liquid discharging groove 11 and liquid discharging pipe 111 (FIG. 4, step S4).

Subsequently, at the finishing timing of the rinse cleaning, first cup 51 and second cup 52 are descended at the same time (step S5). In this case, since the descending speed of second cup 52 is higher than that of first cup 51, the coupling part (curved part 521) of second cup 52 having the high descending speed is overlapped with the coupling part (curved part 511) of first cup 51 having the low descending speed, such that second cup 52 pushes down first cup 51. As a result, two cups 51 and 52 are integrally descended at the descending speed of the reference which is set at second cup 52 without the synchronization control.

In this case, since the flow channel formed between first cup 51 and second cup 52 is sealed by curved parts 511 and 521 which are coupled to each other, even though the rinse liquid including the alkali processing liquid is scattered around by the rotation of wafer W, cups 51 and 53 may be switched while suppressing the processing liquids from entering the flow channel. From this viewpoint, curved parts 511 and 521 also serve as a sealing part that seals the flow channel (gap) formed between first cup 51 and second cup 52.

When the two cups move up to the retracting position to become a state shown in FIG. 5, a natural oxide film on the surface of wafer W is removed by supplying the acidic processing liquid from acidic liquid supply unit 43 (step S6). The processing liquid flung away from spin chuck 21 is received in the inner wall surface of third cup 53 to pass through the flow channel between second cup 52 and third cup 53, third liquid discharging groove 13, and liquid discharging pipe 131 and recovered in the recovery tank and discharged to the outside.

When the liquid processing with the acidic processing liquid is completed for a predetermined time, the processing liquid supplied to processing liquid nozzle 31 is switched into the rinse liquid from rinse liquid supply unit 45, and first cup 51 and second cup 52 at the retracting position are ascended at the same time (step S7). In this case, since the ascending speed of first cup 51 is higher than that of second cup 52, the coupling part (curved part 511) of first cup 51 having the high ascending speed is overlapped with coupling part (curved part 521) of second cup 52 having the low ascending speed, such that first cup 51 pushes up second cup 52. As a result, two cups 51 and 52 are integrally ascended at the ascending speed of the reference which is set at first cup 51 without the synchronization control.

In this case, as described above, the flow channel formed between first cup 51 and second cup 52 becomes a sealed state by both curved parts 511 and 521. Accordingly, even though the rinse liquid including the acidic processing liquid remaining on wafer W is scattered around by the rotation of wafer W, the rinse liquid may be suppressed from entering the discharge path of the alkali processing liquid (the flow channel between first cup 51 and second cup 52, second liquid discharging groove 12, and liquid discharging pipe 121).

In this case, since second cup 52 pushed up by first cup 51 has independent actuator 620, the load applied to actuator 610 of first cup 51 side is smaller than the total weight of first cup 51 and second cup 52. Accordingly, since a required driving force is small as compared with a case where two cups 51 and 52 are ascended by single actuator 610, actuator 610 having an excessively large driving force needs not to be installed.

Figure 4:
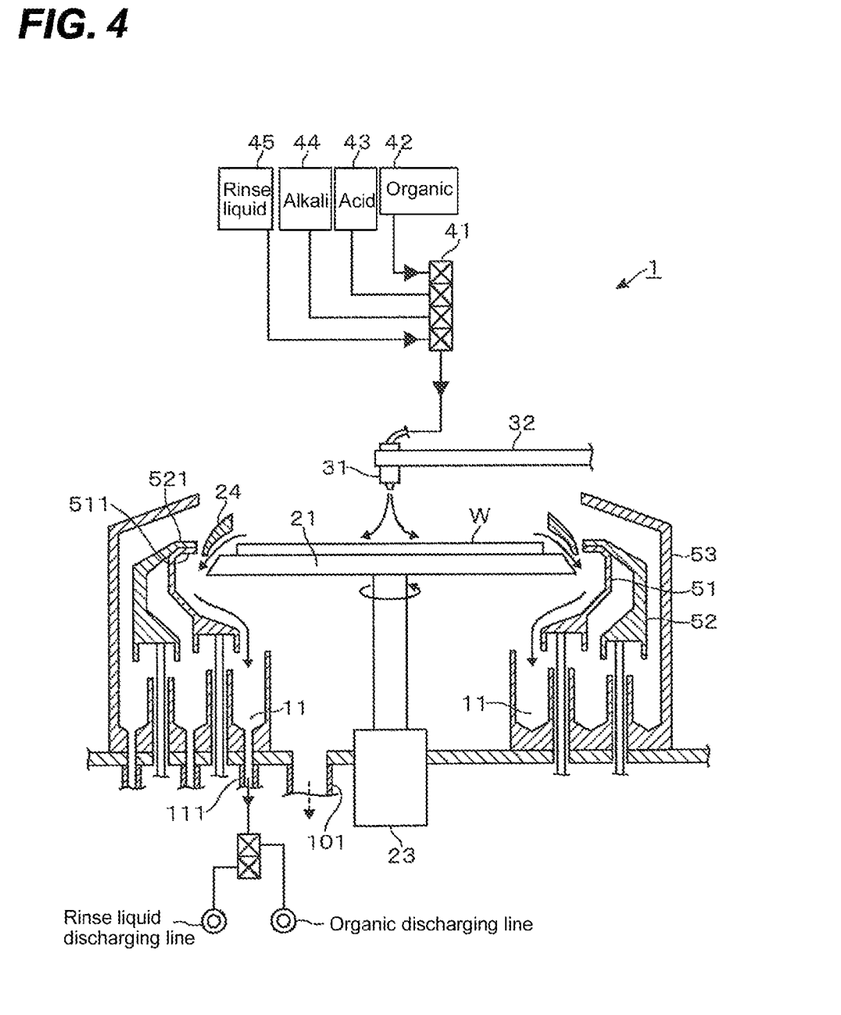
FIG. 4 is a second explanatory diagram illustrating the liquid processing operation of the liquid processing apparatus.

When first and second cups 51 and 52 are ascended up to the processing position, the rinse liquid flung away around spin chuck 21 is received in first cup 51 to be discharged to the outside through first liquid discharging groove 11 and liquid discharging pipe 111 (FIG. 4). Subsequently, the IPA drying is performed by supplying the organic processing liquid from organic liquid supply unit 42 onto the surface of rotating wafer W, and the drying of flinging away the liquid is performed to end the processing of wafer W (step S8). The organic processing liquid flung away from spin chuck 21 is also recovered in the recovery tank and discharged to the outside through first cup 51, first liquid discharging groove 11, and liquid discharging pipe 111 in sequence. In this case, the discharging line of the rinse liquid and the organic processing liquid may be switched at the downstream of liquid discharging pipe 111.

As described above, when the liquid processing is finished as described above, the rotation of spin chuck 21 stops, a vacuum chuck is released, the elevating pins are ascended, and wafer W is transferred to the transfer arm entered from outside and carried out (step S9). Thereafter, with respect to first cup 51 and second cup 52 which wait at the processing position, first cup 51 is descended up to the retracting position at the reference speed while second cup 52 stops and prepares to receive next wafer W (FIG. 3, step S10), and a series of operations are completed (end).

Liquid processing apparatus 1 of the exemplary embodiment has the following effect. The coupling parts (curved parts 511 and 521) which are vertically overlapped with each other are formed at first and second cups 51 and 52 disposed to be adjacent to each other around spin chuck 21. When cups 51 and 52 are ascended at the same time, the ascending speed of first cup 51 is set higher than that of second cup 52 to be vertically overlapped with the coupling parts. When both cups 51 and 52 are descended at the same time, the descending speed of second cup 52 is set larger than that of first cup 51 to be vertically overlapped with the coupling parts. As a result, two cups 51 and 52 may be integrally elevated without performing a synchronization control.

Herein, when the liquid processing is performed by switching the processing liquid, all of the cups need not to be used. For example, when only the liquid processing with the acidic processing liquid, the rinse cleaning, and the IPA drying are performed and the liquid processing with the alkali processing liquid is not performed, the integral elevation of cups 51 and 52 may be repeated while the flow channel between first cup 51 and second cup 52 is sealed. In this case, in liquid processing apparatus 1, the rinse liquid and the organic processing liquid are discharged by first cup 51 and the acidic processing liquid is discharged by third cup 53, but second cup 52 is not used. Thereafter, when the liquid processing including the alkali processing liquid is performed, second cup 52 restarts to be used by changing an elevating sequence of cups 51 and 52 so as to perform the operation described with reference to FIG. 2.

Besides, in the example shown in FIG. 5, when first cup 51 and second cup 52 are descended up to the retracting position, the curved parts 521, 511 serving as the sealing parts are vertically overlapped with each other to seal the flow channel formed between both cups 52 and 51. Herein, for example, when first cup 51 moves up to the further lower position and a gap between curved parts 521, 511 is opened, cups 51, 52 are ascended up to the processing position.

In this case, when first cup 51 starts to be ascended faster than second cup 52 and reaches the retracting position of second cup 52 to seal the gap between curved parts 521 and 511, second cup 52 starts to be ascended so that both cups 51 and 52 are ascended at the same time. The flow channel between two cups 51 and 52 is sealed and then second cup 52 starts to be ascended, such that the processing liquid scattered from rotating wafer W may be suppressed from entering into the flow channel.

The above-described operation is effective even when second cup 52 is positioned above first cup 51 when first cup 51 and second cup 52 are ascended up to the processing position. That is, even when the descending of second cup 52 starts faster than that of first cup 51 and second cup 52 reaches the processing position of first cup 51 to seal the gap between curved parts 521 and 511, the descending of first cup 51 starts so as to descend both cups 51 and 52 at the same time, the same effect may be obtained as the case of ascending.

A correspondence of cups 51 to 53 to be used according to a kind of the processing liquid is not limited to the example illustrated in the aforementioned exemplary embodiment. For example, first cup 51 may be used during the processing of the alkali processing liquid or the acidic processing liquid, and second cup 52 may be used during the processing with the acidic processing liquid, the rinse cleaning, or the IPA drying. Third cup 53 may be used during the processing with the alkali processing liquid, the rinse cleaning, or the IPA drying, and the present disclosure may be applied to a case of differentiating processing liquids other than the processing liquids exemplified above.

Figure 6:
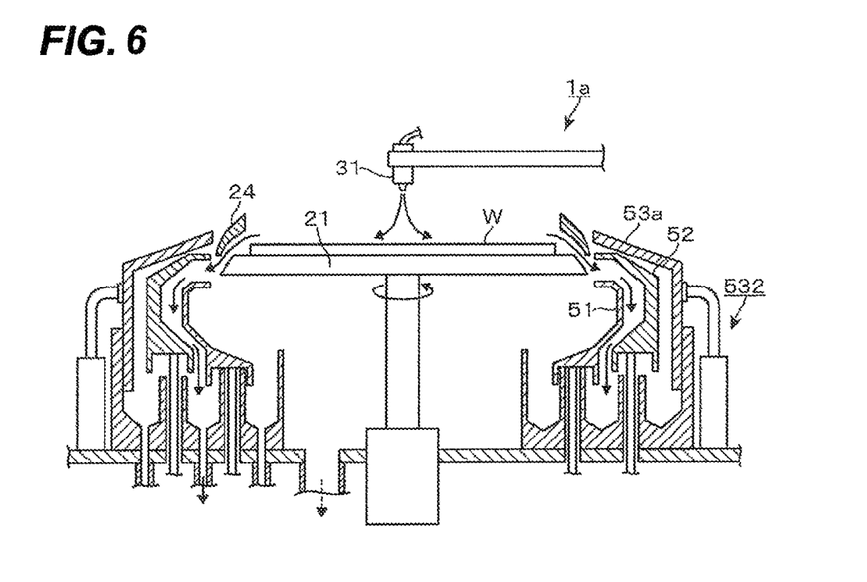
FIG. 6 is a first explanatory diagram illustrating a liquid processing apparatus according to another exemplary embodiment of the present disclosure.
Figure 7:
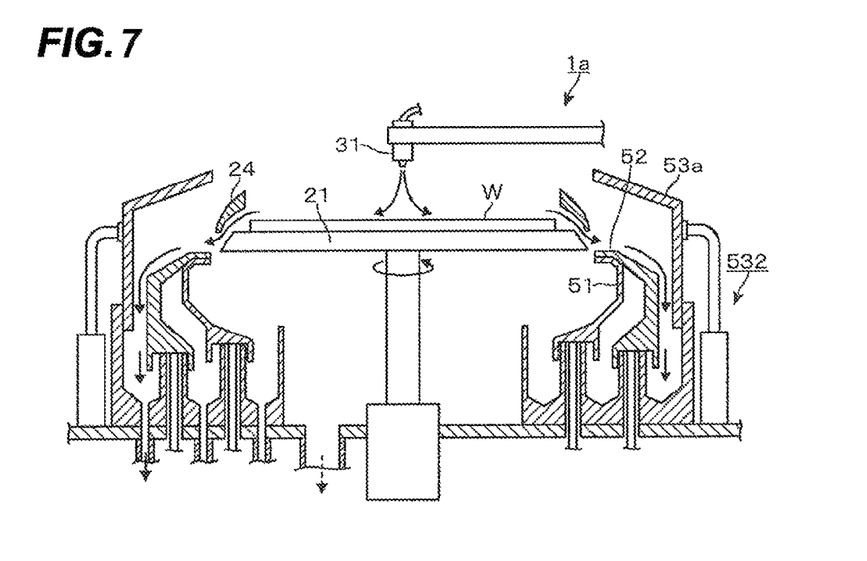
FIG. 7 is a second explanatory diagram illustrating the liquid processing apparatus according to the another exemplary embodiment of the present disclosure.

FIGS. 6 and 7 illustrate an example of a liquid processing apparatus 1a including a third cup 53a which is elevatable. Third cup 53a of the exemplary embodiment is divided into a vertical direction and the upper side thereof is held by an elevating mechanism 532. As shown in FIG. 6, when the processing liquid is received in second cup 52 (or first cup 51), third cup 53a is descended up to the just above second cup 52 to block the flow channel between second cup 52 and third cup 53a, and thus, another processing liquid is prevented from entering into the flow channel. Meanwhile, when the processing liquid is received in third cup 53a, as shown in FIG. 7, first cup 51 and second cup 52 are retracted up to the retracting position and third cup 53a is ascended to perform the liquid processing.

When first cup 51 and second cup 52 are integrally elevated, the coupling parts which are vertically overlapped with each other are not limited to the case of using curved parts 511, 521 installed at the upper ends of cups 51, 52. For example, as shown FIG. 8, coupling parts 513, 523 may be installed at the base part side of cups 51, 52. For example, when piece-shaped coupling parts 513, 523 are is scattered along the circumferential direction of each cup 51 or 52, the processing liquid flowing through the flow channel between first cup 51 and second cup 52 is not blocked, and the processing liquid may be discharged to second liquid discharging groove 12.

The coupling parts are not limited to the case where the coupling parts are installed at first cup 51 and second cup 52, and may be installed at the elevating member side of cups 51, 52. For example, in FIG. 8 in which coupling parts 614, 624 coupling with each other configure a part of the elevating member of cups 51, 52 and are installed around a circumferential direction of connecting members 612, 622 formed of an annularly-formed board, is shown together. Besides, when the coupling parts are installed at the elevating member, members which are vertically overlapped with, for example, support members 611, 621 or lifting shafts 613, 623 may also be installed.

Figure 8:
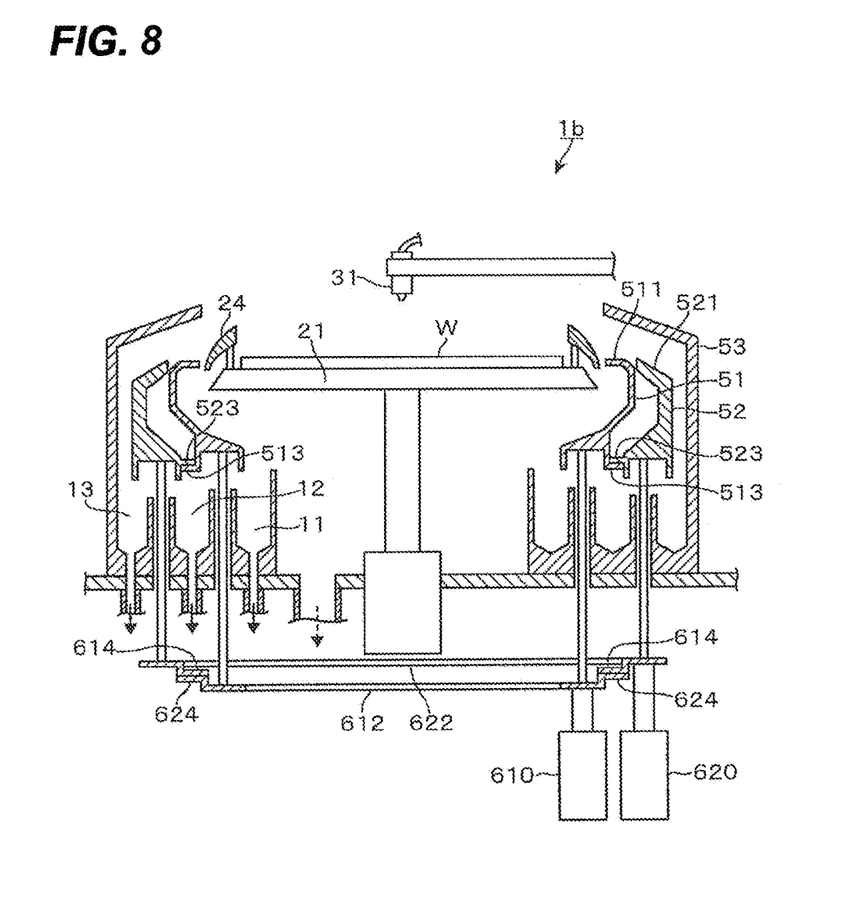
FIG. 8 is an explanatory diagram illustrating a liquid processing apparatus according to yet another exemplary embodiment of the present disclosure.

In this case, curved parts 511, 521 may also not serve as the coupling parts and coupling parts 513, 523 may also be omitted. In this case, curved part 521 serves as a sealing part sealing the flow channel between first cup 51 and second cup 52 or serves to guide the scattered processing liquid. As a result, cups 51, 52 in a liquid processing apparatus 1b are not contacted with each other, thereby suppressing generation of particles.

Third cup 53 may not always be installed, and for example, a liquid discharging pipe may be installed at the bottom of the case housing liquid processing apparatus 1, and then the processing liquid may also be discharged through the liquid discharging pipe.

In liquid processing apparatuses 1, 1a, 1b according to the respective exemplary embodiments, the liquid processing is performed by supplying the processing liquid onto the surface (top surface) of wafer W, but the target surface of wafer W is not limited thereto. For example, in the case where the backside (bottom surface) of wafer W is included in the target surface, the present disclosure may also be applied to the case where a supply channel of the processing liquid is formed in rotation shaft 22 of spin chuck 21 to supply the processing liquid to the target surface (bottom surface).

The target substrate processed by liquid processing apparatuses 1, 1a, 1b of the present disclosure is not limited to the semiconductor wafer and the present disclosure may also be applied to a liquid processing apparatus processing, for example, a square-shaped substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus, comprising:
   a rotation holding unit configured to hold and rotate a substrate to be processed around a vertical shaft;
   a processing liquid supply unit configured to supply a processing liquid onto a target surface of the substrate held by the rotation holding unit;
   a first cup and a second cup configured to receive the processing liquid scattered from the substrate to guide the received processing liquid downwards;
   a first driving unit configured to elevate the first cup through a first elevating member between a processing position receiving the processing liquid scattered from the rotating substrate and a retracting position located lower than the processing position and to change a set value of an elevating speed of the first cup;
   a second driving unit configured to elevate the second cup through a second elevating member between a processing position receiving the processing liquid scattered from the rotating substrate and a retracting position located lower than the processing position and to change a set value of an elevating speed of the second cup; and
   a controller configured to output a control signal to the first driving unit and the second driving unit so as to ascend the first cup at a higher speed than the second cup such that the second cup is pushed up by the first cup while at least a portion of the first cup is overlapped with at least a portion of the second cup, thereby sealing a flow path formed between the first cup and the second cup, when the first cup and the second cup are ascended to the processing position from the retracting position at the same time.

2. The liquid processing apparatus of claim 1, wherein the controller outputs the control signal to the first driving unit and the second driving unit so as to descend the first cup at a lower speed than the second cup such that such that the first cup is pushed down by the second cup while at least at least a portion of the second cup is overlapped with at least a portion of the first cup thereby sealing a flow path formed between the first cup and the second cup, when the first cup and the second cup are descended to the retracting position from the processing position at the same time.

3. The liquid processing apparatus of claim 1, further comprising:
   a sealing part configured to seal a gap formed between the first cup and the second cup when the first cup and the second cup are ascended at the same time.

4. The liquid processing apparatus of claim 2, further comprising:
   a sealing part configured to seal a gap formed between the first cup and the second cup when the first cup and the second cup are descended at the same time.

5. The liquid processing apparatus of claim 3, wherein the sealing part is installed to at least one side of the first cup and the second cup, and
   the controller outputs the control signal to the first driving unit and the second driving unit so that the first cup and the second cup are ascended at the same time after sealing the gap with the sealing part, by positioning the second cup above the first cup where the gap is not sealed with the sealing part when the first cup and the second cup are descended up to the retracting position and by starting the ascending of the first cup to be faster than that of the second cup when the first cup and the second cup are ascended.

6. The liquid processing apparatus of claim 4, wherein the sealing part is installed to at least one side of the first cup and the second cup, and
   the controller outputs the control signal to the first driving unit and the second driving unit so as to descend the first cup and the second cup at the same time after sealing the gap with the sealing part, by positioning the first cup below the second cup where the gap is not sealed with the sealing part when the first cup and the second cup are ascended up to the processing position and by starting the descending of the second cup to be faster than that of the first cup when the first cup and the second cup are descended.

* * * * *